United States Patent [19]
Yamada

[11] Patent Number: 5,172,331
[45] Date of Patent: Dec. 15, 1992

[54] APPARATUS AND METHOD FOR EFFECTING EXPOSURE OF SAMPLE TO CHARGED PARTICLE BEAM

[75] Inventor: Akio Yamada, Kawasaki, Japan

[73] Assignee: Fujitsu Limited, Kanagawa, Japan

[21] Appl. No.: 629,739

[22] Filed: Dec. 18, 1990

[30] Foreign Application Priority Data

Dec. 18, 1989 [JP] Japan .................................. 1-327825
Jul. 12, 1990 [JP] Japan .................................. 2-182578

[51] Int. Cl.$^5$ ............................................. G06F 15/20
[52] U.S. Cl. .............................. 364/491; 250/396 R; 250/397; 250/492.2; 250/492.3
[58] Field of Search ........... 250/396 R, 396 ML, 397, 250/491.1, 492.2, 492.3; 364/491

[56] References Cited

U.S. PATENT DOCUMENTS

| | | | |
|---|---|---|---|
| 4,443,704 | 4/1984 | Yamashita et al. | 250/491.1 |
| 4,489,241 | 12/1984 | Matsuda et al. | 250/492.2 X |
| 4,789,945 | 12/1988 | Nijima | 250/491.1 X |
| 4,807,159 | 2/1989 | Komatsu et al. | 364/571.01 X |
| 4,897,552 | 1/1990 | Okunuki et al. | 250/396 R X |
| 5,047,646 | 9/1991 | Hattori et al. | 250/396 R |

Primary Examiner—Parshotam S. Lall
Assistant Examiner—Edward R. Cosimano
Attorney, Agent, or Firm—Nikaido, Marmelstein, Murray & Oram

[57] ABSTRACT

An apparatus includes an optical unit for effecting an exposure of a sample to a charged particle beam and a control unit for effecting a deflection control of the charged particle beam. The control unit calculates a basic waveform based on the scanning of a beam having a constant width on a mark pattern, divides a cross section of a selective block pattern into portions by the constant width, calculates respective waveforms based on the scanning of only a beam of each portion using the basic waveform, and sequentially displaces the calculated waveforms with units of the constant width and overlaps the displaced waveforms to determine a forecast waveform. The control unit calculates a compensated deflection data based on a comparison of the forecast waveform and a waveform measured in the actual scanning of the selective block pattern and deflects a beam based on the calculated data to project the beam on the sample. As a result, it is possible to precisely determine a position of application of the beam to the sample irrespective of geometrical conditions of the selective block pattern and thus effect the exposure with high precision.

13 Claims, 12 Drawing Sheets

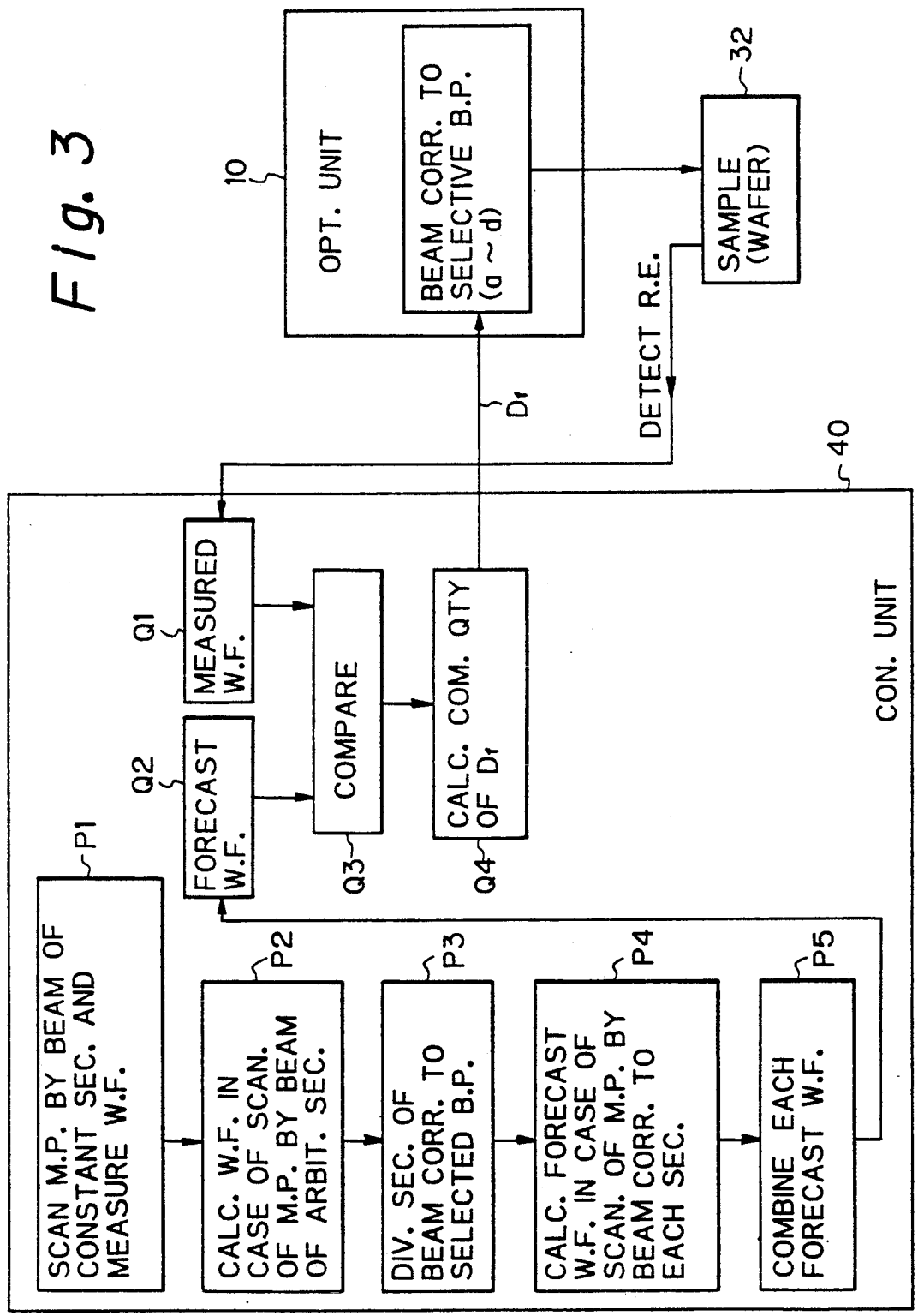

$$\left(P_x = P_0 \frac{L_x}{L_0}, \quad g_x = g_0 \frac{L_x}{L_0}\right)$$

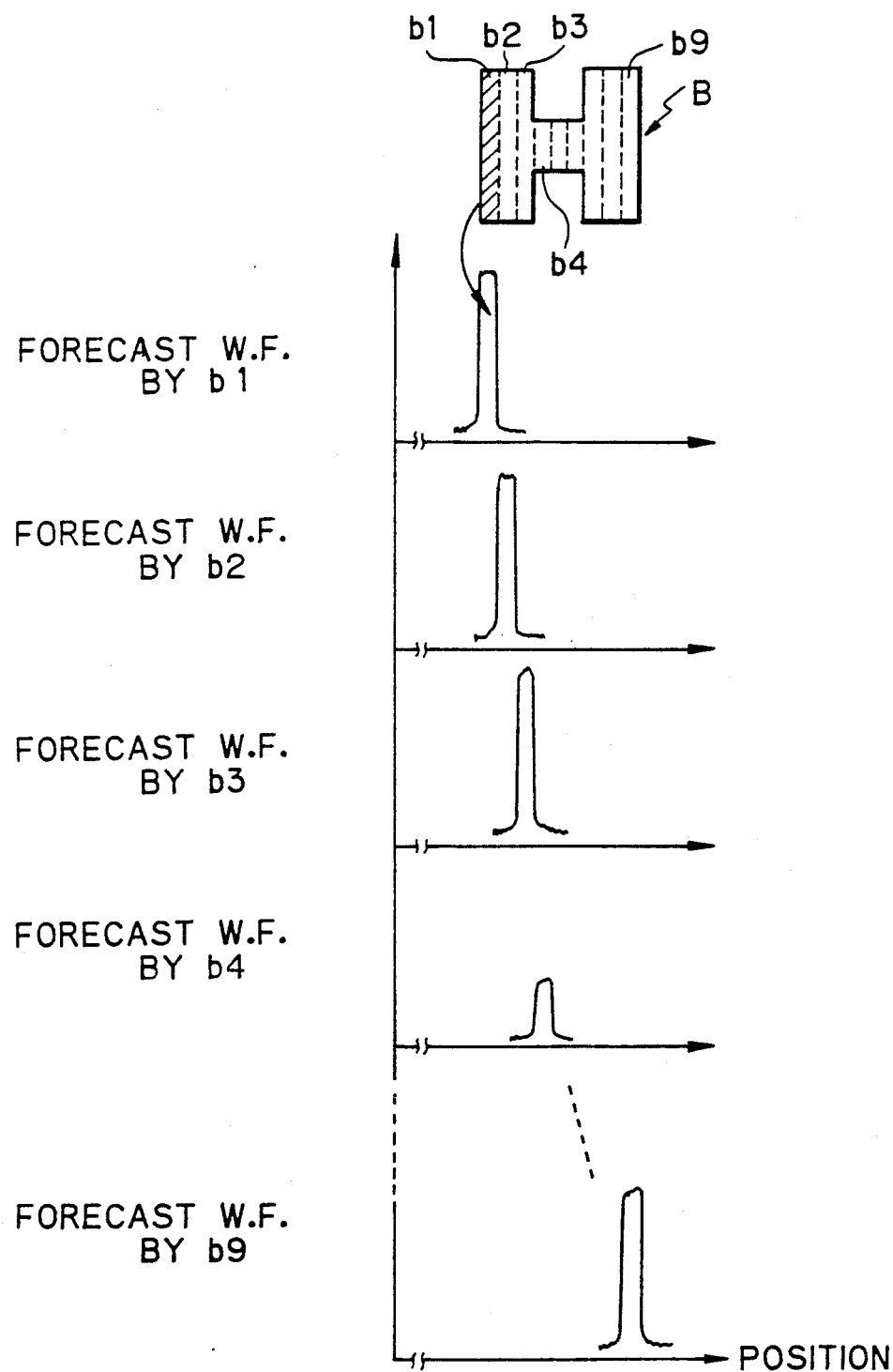

APPARATUS AND METHOD FOR EFFECTING EXPOSURE OF SAMPLE TO CHARGED PARTICLE BEAM

BACKGROUND OF THE INVENTION

1. Field of the Invention

The present invention relates to a technique of effecting an exposure of a sample to a charged particle beam. More particularly, it relates to a constitution of an apparatus and a method for forming a fine pattern on a sample (wafer) using an electron beam.

Recently, with a high density of integrated circuits, photolithography which has heretofore been a primary technique of forming a fine pattern has been substituted by a novel technique of effecting an exposure using electrons (electron beam), and the novel technique has practically come into use.

2. Description of the Related Art

A conventional electron beam exposing apparatus is a pattern-drawing apparatus which deflects and scans an electron beam having a variable rectangular section on a sample (wafer) to form a pattern. Namely, it is an apparatus having a function of generating a "hardware" pattern from a "software" pattern data.

Since a prior art exposure has been realized by successively linking a one-shot beam having a rectangular cross section to draw a pattern, a drawback occurs in that, the smaller the pattern size becomes, the more the exposing shot per unit size (unit square) is increased in number. This causes a lowering in throughput. To cope with this, a so-called block pattern transfer type exposing technique has been proposed which is intended to obtain a practical throughput even in the forming of an ultra-fine pattern.

In a semiconductor device necessitating the drawing of an ultra-fine pattern, e.g., a dynamic random access memory (DRAM) having a capacity of nominal 64M ($1M = 10^6$), there is often seen a case that a greater part of the area, which is the object of exposure although it is a fine pattern, is constituted by a repetition of a certain basic pattern. In this case, where the basic pattern can be generated with a single shot (one shot) irrespective of a complexity thereof, it becomes possible to effect the exposing processing with a constant throughput irrespective of a fineness of the pattern per se. In this regard, there is proposed the above block pattern transfer type exposure which applies an electron beam to a transmission mask on which the basic pattern is formed, generates one-shot beam having a section of the shape of the basic pattern, and successively links the one-shot beam to form a repetition pattern.

In an example of the prior art block pattern transfer type exposure, a transmission mask having a basic block pattern in the form of an opening formed into a predetermined shape is employed, as described later in detail. The exposing processing is carried out by transmitting an electron beam through the opening, giving optical treatments by means of lenses, deflectors, or the like, to the electron beam having a section of the predetermined shape, and then projecting the shaped electron beam on a wafer.

In this case, a reduced transfer image of the opening is projected on the wafer. Accordingly, where the transmission mask has a plurality of different block patterns, a disadvantage occurs in that, under a condition that the shaped beam is not deflected back to an original optical axis, a position of a transfer image corresponding to each of the block patterns is different from each other depending on geometrical conditions (arrangement and shape) of a selected block pattern. This is an obstacle to the forming of a repetition pattern by link of transfer images (one-shot beams).

To cope with this, there is proposed a technique in which quantity of deflection of the shaped electron beam is suitably controlled in a downstream side of the transmission mask and, even if any one of the block patterns is selected, a transfer image corresponding to the selected block pattern is controlled to be projected at a substantially identical position on the wafer. Even by use of the technique, however, it is difficult to precisely bring the respective position of transfer images corresponding to all of the block patterns to an identical position on the wafer. Problems in the prior art will be explained in detail later in conjunction with the preferred embodiments of the present invention.

SUMMARY OF THE INVENTION

An object of the present invention is to provide a charged particle beam exposing apparatus and method which can precisely determine a position of application of a beam to a sample irrespective of geometrical conditions of a selected block pattern and thus effect the exposure with high precision.

According to one aspect of the present invention, there is provided an apparatus for effecting an exposure of a sample to a charged particle beam, the apparatus including: and optical unit for shaping a cross section of the charged particle beam into a shape corresponding to a predetermined selective block pattern, giving appropriate optical treatments to the shaped beam, and deflecting the beam based on deflection data to project the deflected beam on the sample; and a deflection control unit for detecting a distribution of reflected charged particles obtained when a beam corresponding to the selective block pattern is actually scanned on a mark pattern located at a predetermined position, calculating a compensated quantity of the deflection data based on a comparison of a waveform based on the detecting and a forecast waveform based on a specific calculation, and thus controlling the deflection of the charged particle beam.

The deflection control unit includes: a unit for scanning a first beam having a predetermined width in the scanning direction and having a constant cross section on the mark pattern and measuring a waveform corresponding to a distribution of reflected charged particles generated based on the scanning; a unit for calculating a waveform corresponding to a distribution of reflected charged particles forecast to be obtained when a second beam having the predetermined width and having an arbitrary cross section is scanned on the mark pattern, as a basic waveform, based on the measured waveform; a unit for dividing a cross section of the beam corresponding to the selective block pattern into a plurality of portions by the predetermined width in the scanning direction; a unit for calculating respective waveforms forecast to be obtained when only a beam corresponding to each of the divided plurality of portions is scanned on the mark pattern, based on the basic waveform and a cross section of the beam of the corresponding portion; and a unit for sequentially displacing the calculated respective waveforms with units of the predetermined width and overlapping the displaced waveforms, whereby the forecast waveform forecast to be obtained when a beam corresponding to the whole selective block pattern is scanned on the mark pattern is determined.

According to another aspect of the present invention, there is provided a method for effecting an exposure of a sample to a charged particle beam, the method including the steps of: shaping a cross section of a charged particle beam into a shape corresponding to a predetermined selective block pattern; detecting a distribution of reflected charged particles obtained when the shaped beam is actually scanned on a mark pattern located at a predetermined position; measuring a waveform based on the detecting; determining a forecast waveform based on a specific calculation; calculating a compensated deflection data based on a comparison of the measured waveform and the forecast waveform; and deflecting the charged particle beam based on the compensated deflection data to project the deflected beam on the sample.

The step of determining the forecast waveform includes the substeps of: scanning a beam having a predetermined width in the scanning direction and having a constant cross section on the mark pattern to measure a waveform corresponding to a distribution of reflected charged particles generated by the scanning; calculating a waveform corresponding to a distribution of reflected charged particles forecast to be obtained when a beam having the predetermined width and having an arbitrary cross section is scanned on the mark pattern, as a basic waveform, based on the measured waveform; dividing a cross section of the beam corresponding to the selective block pattern into a plurality of portions by the predetermined width in the scanning direction; calculating respective waveforms forecast to be obtained when only a beam corresponding to each of the divided plurality of portions is scanned on the mark pattern, based on the basic waveform and a cross section of the beam of the corresponding portion; and sequentially displacing the calculated respective waveforms with units of the predetermined width and overlapping the displaced waveforms to determine the forecast waveform.

BRIEF DESCRIPTION OF THE DRAWINGS

Other objects and features of the present invention will be described hereinafter in detail by way of preferred embodiments with reference to the accompanying drawings, in which:

FIG. 3 is a block diagram for explaining the principle of the charged particle beam exposing apparatus according to the present invention;

FIG. 9 is a view for explaining a concrete example of the processing P4 shown in FIG. 3;

DESCRIPTION OF THE PREFERRED EMBODIMENTS

Figure 1A:
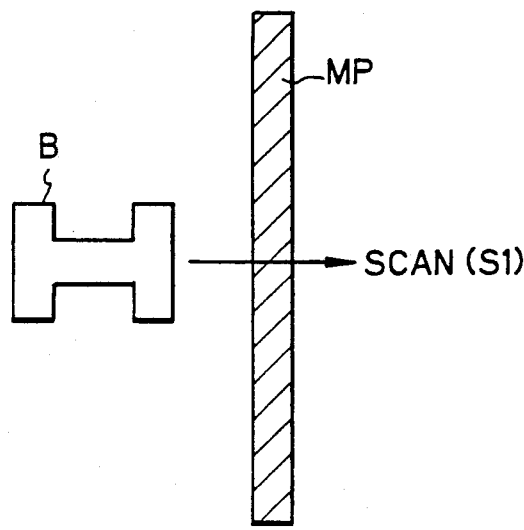
FIGS. 1a to 1d are views for explaining relationships between the scanning of a beam having a section of a predetermined shape on a mark pattern and the quantity of reflected electrons generated based on the scanning.

For a better understanding of the preferred embodiments of the present invention, the problem in the prior art will be explained with reference to FIGS. 1a to 1d, 2a to 2d, 4, 5a and 5b. Note, FIGS. 1a to 1d, 4, 5a and 5b apply not only to the prior art but also to the embodiments of the present invention.

In a conventional exposing system (see FIG. 4, optical unit 10), an electron beam emitted from an electron gun 14 is transmitted through a member 15 having an aperture to be shaped into a rectangle, receives optical treatments by means of lenses, deflectors, or the like, and is applied to a portion of a desired block pattern (basic pattern constituting a unit of a repetition pattern) on a stencil mask (transmission mask) 20. The block pattern has the form of an opening formed to be a predetermined shape (see FIGS. 5a and 5b). In the illustration, four block patterns (a to d) are formed. FIG. 5b shows a cross section of FIG. 5a taken along line B—B.

The electron beam applied to the portion of a selected block pattern (opening) is shaped into a shape corresponding to the selected block pattern, then receives optical treatments by means of lenses, deflectors, or the like, and is projected on a wafer 32. Thus, the exposure is carried out.

In the above exposing system, a reduced transfer image of the selected opening (block pattern) is projected on the wafer. Accordingly, where different block patterns (e.g., pattern b and pattern d in FIG. 5a) are selected, a disadvantage occurs in that, when the shaped beam is not rightly deflected back to an original optical axis, a transfer image corresponding to each of the block patterns is different in position from each other on the wafer 32 depending on geometrical conditions (arrangement and shape) of the selected block pattern. This is not preferable from a viewpoint of the forming of a repetition pattern by link of transfer images.

To cope with this (see FIG. 4), quantity of deflection of the shaped electron beam is suitably controlled by deflectors 23, 24 in a downstream side of the stencil mask 20 and, even if any one of the block patterns (a to d) is selected, a transfer image corresponding to the selected block pattern is controlled to be projected on a substantially identical position on the wafer.

However, it is very difficult to precisely bring the respective position of transfer images corresponding to all of the block patterns to the identical position on the wafer. As a result, the respective position of the transfer images may slightly (approximatley 0.5 μm) differ from each other. Namely, offsets inevitably arise in the positions of the transfer images in dependence on geometrical conditions of the selected block pattern.

In this regard, there are posed the following problems: (a) how to measure a slight difference (quantity of offset) of the respective transfered image position for individual block patterns; and (b) how to compensate the respective quantity of offset in an actual exposing processing. To cope with these problems, the present inventor previously proposed approaches described below.

(1) Approach to problem (a)

A mark pattern MP having a predetermined shape is provided on a sample (wafer) or a sample supporting member located on the substantially same height as a surface of the sample. On the other hand, the shape of section of a beam projected on the sample is determined according to the shape of a selected block pattern. Therefore, when the beam is scanned on the mark pattern in a certain direction, it is possible to forecast a distribution (waveform) of quantity of electrons (secondary electrons) reflected from the mark pattern.

Figure 1B:
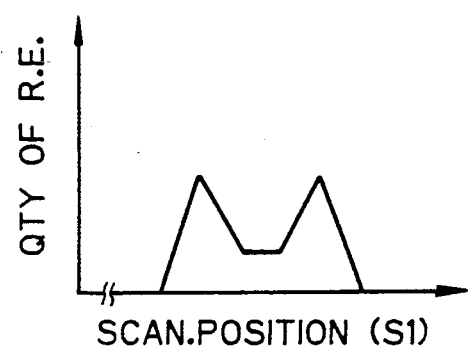
Figure 1C:
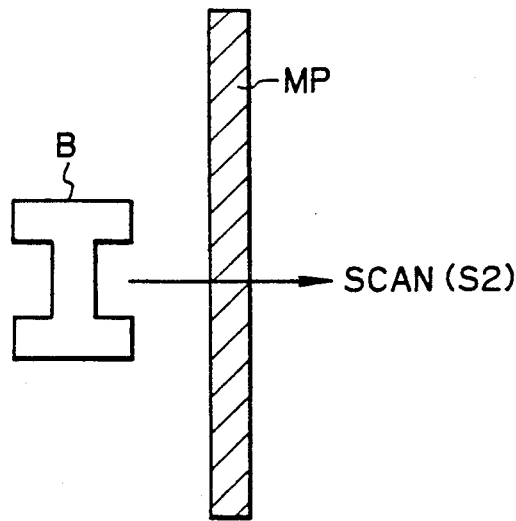
Figure 1D:
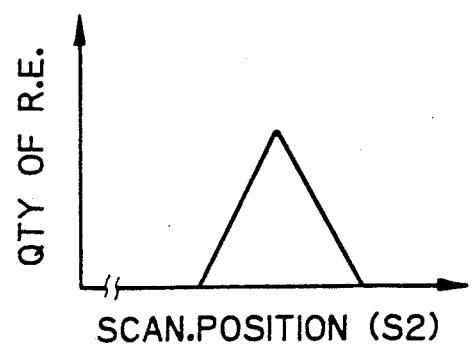

FIGS. 1a to 1d show relationships between the scanning of a beam on a mark pattern and the quantity of reflected electrons generated based on the scanning. In the illustration, FIGS. 1a and 1c show the scanning manners in the cases that an electron beam B whose section is shaped into a letter "H" is scanned in different directions S1 and S2, respectively, on a mark pattern MP having a predetermined shape, while FIGS. 1b and 1d show the distributions (forecast waveforms) of the quantity of reflected electrons corresponding to FIGS. 1a and 1c, respectively.

As shown in FIGS. 1a to 1d, when the beam having a section of the predetermined shape is scanned on the mark pattern having the predetermined shape, it is possible to obtain the forecast waveform. The forecast waveform is compared with a waveform (measured waveform) corresponding to a distribution of reflected electrons obtained when the beam is actually scanned on the mark pattern in the corresponding direction, and thus, the aforementioned difference (quantity of offset) of the transfer position is measured.

(2) Approach to Problem (b)

The above measured quantity of offset is compensated by regulating the quantity of deflection of the shaped electron beam. To this end, a memory unit is provided at a preceding stage of a digital/analog (D/A) converting unit which converts deflection data (digital values) into analog values to feed the converted deflection data to deflectors 30, 31 (see FIG. 4). The memory unit stores data of quantities of offset measured for each of a plurality of block patterns a, b, c, . . . , i.e., data of compensated quantities of offset. Each of the compensated quantities of offset is allocated to a respective address indicated by a recognition number #a1, #b1, #c1, . . . , of a corresponding block pattern.

In the actual exposure, data of compensated quantity of offset corresponding to a selected block pattern is read from the memory unit according to the corresponding recognition number, and the read data of compensated quantity is added to a deflection data which is determined by data concerning the arrangement of block patterns and stage feedback data. The added data is fed as a compensated deflection data to the deflectors 30, 31 and thus the exposure is carried out.

In the above approaches, the problem is what signal waveform should be prepared for the forecast waveform to be determined in advance. Assuming that there is no deviation in the direction of emission of reflected electrons and a sensitivity of a detector 39 (see FIG. 4) for the reflected electrons, and that each operation speed of the detector and amplifiers is ideally high. In this case, it is possible to forecast a waveform corresponding to a distribution of reflected electrons in the form approximate to the actual waveform by checking how the shape (area) of the overlapping portion between the mark pattern and the projected beam is changed according to the scanning of the beam.

Figure 2A:
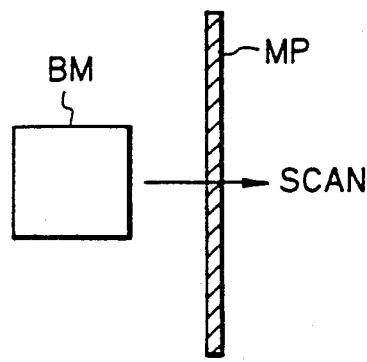
FIGS. 2a to 2d are views for explaining problems due to a prior art block pattern transfer type exposing method.
Figure 2C:
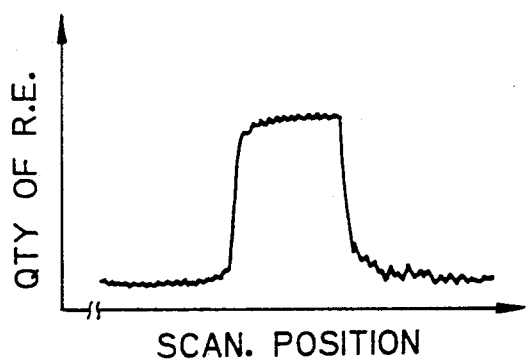
Figure 2B:
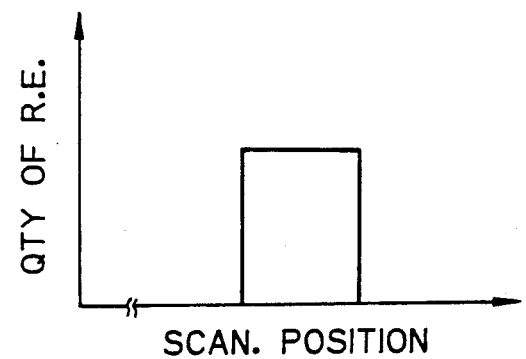
Figure 2D:
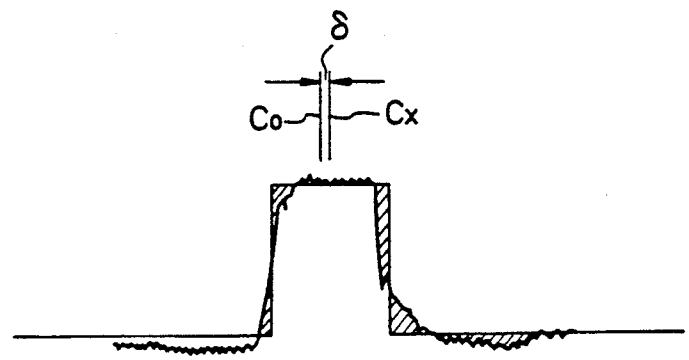

However, the situation of an actual detection of the reflected electrons is far from the above ideal situation. For example, referring to FIGS. 2a to 2d, even if a waveform corresponding to a distribution of the reflected electrons is forecast as shown in FIG. 2b in the ideal situation after being scanned in FIG. 2a, there is a possibility in that the waveform is measured as shown in FIG. 2c in the actual situation. Where the magnitudes of quantity of the reflected electrons are matched or harmonized between the forecast waveform and the measured waveform under a condition that a overlapping portion between both waveforms is largest, a beam position Cx determined by the above approach is deviated by quantity of offset $\delta$ from the center position $C_o$ of the actual beam (see FIG. 2d).

Thus, since there are so many factors to be considered, it is very difficult to forecast a waveform corresponding to a distribution of reflected electrons in harmony with actual conditions of the detection, even if actually not impossible.

FIG. 3 illustrates the fundamental constitution of the charged particle beam exposing apparatus according to the present invention.

In the illustration, reference 10 denotes an optical unit which shapes a cross section of a charged particle beam (e.g., electron beam) into a shape corresponding to a predetermined selective block pattern (a~d), gives appropriate optical treatments to the shaped beam, and deflects the beam based on deflection data Df to project the deflected beam on a sample (wafer) 32. Reference 40 denotes a control unit which carries out processings of detecting a distribution of reflected charged particles obtained when a beam corresponding to the selective block pattern is actually scanned on a mark pattern located at a predetermined position (e.g., on the sample 32), measuring a waveform (Q1) based on the detecting, then determining a forecast waveform (Q2) based on a specific calculation (described below), comparing (Q3) the measured waveform with the forecast waveform, then calculating (Q4) a compensated quantity of the deflection data Df based on the comparing, thereby controlling the deflection of the charged particle beam.

To determine the above forecast waveform Q2, the deflection control unit 40 includes: a unit (P1) for scanning a beam having a predetermined width in the scanning direction and having a constant cross section on the mark pattern and measuring a waveform corresponding to a distribution of reflected charged particles generated based on the scanning; a unit (P2) for calculating a waveform corresponding to a distribution of reflected charged particles forecast to be obtained when a beam having the predetermined width and having an arbitrary cross section is scanned on the mark pattern, as a basic waveform, based on the measured waveform; a unit (P3) for dividing a cross section of the beam corresponding to the selective block pattern into a plurality of portions by the predetermined width in the scanning direction; a unit (P4) for calculating respective waveforms forecast to be obtained when only a beam corresponding to each of the divided plurality of portions is scanned on the mark pattern, based on the basic waveform and a cross section of the beam of the corresponding portion; and a unit (P5) for sequentially displacing the calculated respective waveforms with units of the predetermined width and overlapping the displaced waveforms.

According to the above constitution, the forecast waveform (Q2) corresponding to a distribution of reflected charged particles forecast to be obtained when a beam corresponding to a selectable arbitrary block pattern is scanned on the mark pattern is calculated based on the basic waveform measured based on the actual scanning and the cross section of the beam corresponding to the arbitrary block pattern. The calculated forecast waveform is compared with the measured waveform obtained when the beam corresponding to the arbitrary block pattern is actually scanned on the mark pattern, and thus, the position of application of the beam to the sample is determined.

In this case, the forecast waveform (Q2) is determined under consideration of all of factors, e.g., arrangement of the mark pattern, dispersion and performance in the operation of the detecting system for reflected charged particles, and the like, which have made causes for problems in the prior art. As a result, the forecast waveform considerably approximates to the corresponding actual waveform. Therefore, even if any one of the block patterns having geometrical conditions (arrangement and shape) different from each other is selected, it is possible to precisely determine the position of application of the beam to the sample and thus effect the exposure with high precision.

Next, a preferred embodiment of the present invention will be explained with reference to FIGS. 4 to 10.

Figure 4:
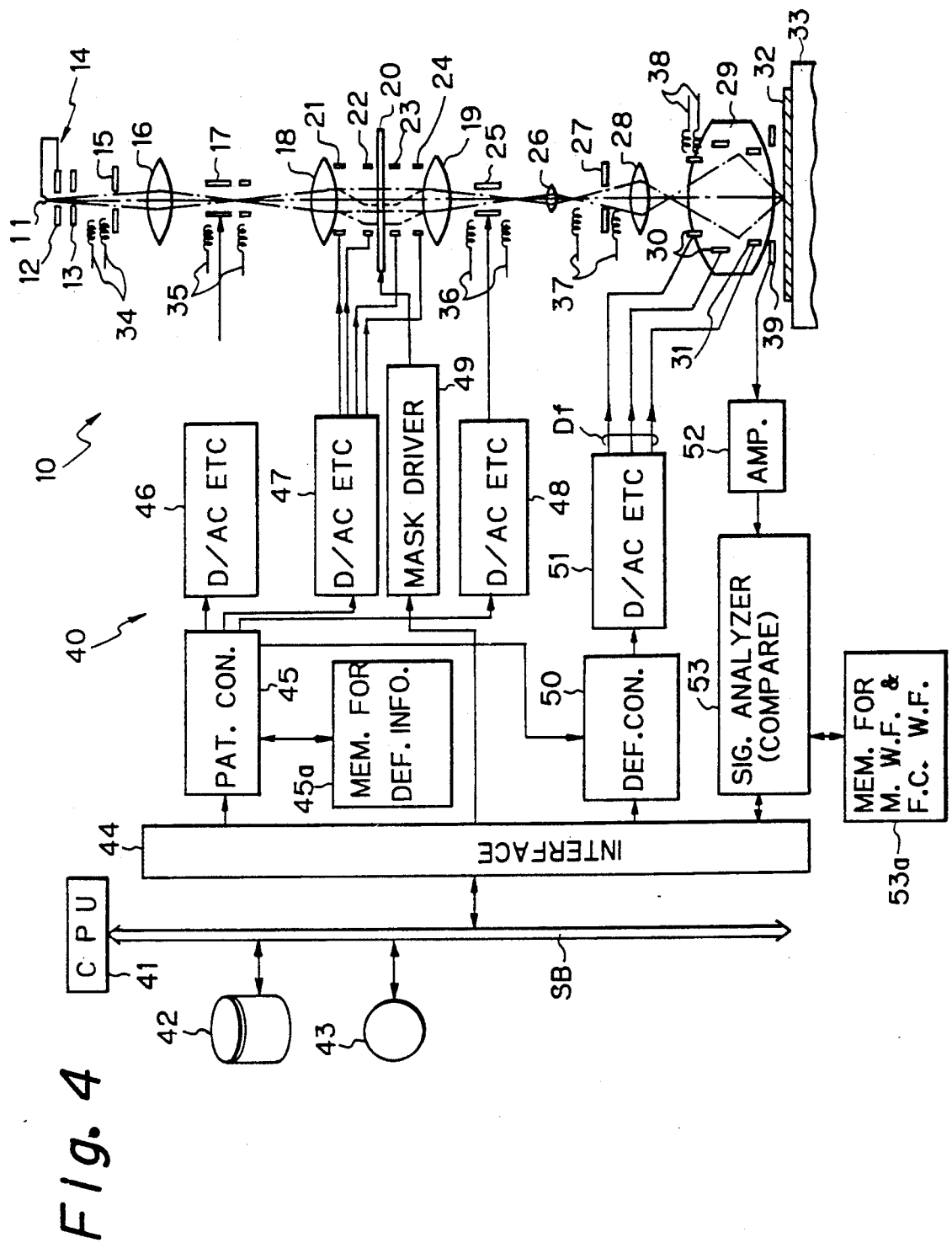
FIG. 4 is a block diagram illustrating, partially schematically, an entire constitution of the electron beam (E.B.) exposing apparatus according to an embodiment of the present invention.

FIG. 4 illustrates an entire constitution of the electron beam (E.B.) exposing apparatus according to an embodiment of the present invention.

Roughly classifying, the illustrated apparatus is constituted by the optical unit 10 for effecting the exposure and the control unit 40 for effecting a deflection control of the electron beam. Note, the optical unit 10 is incorporated into a column (not shown) together with the sample (wafer) 32 and a stage 33 placing the wafer 32 thereon.

The optical unit 10 includes: an electron gun 14 for emitting an electron beam upon receipt of high voltage between a cathode 11 and plates 12, 13; a member 15 having a rectangular aperture for transmitting the emitted electron beam; a lens 16 for focussing the transmitted beam; an electrostatic deflector 17 for deflecting the focussed beam; a lens 18 for converting the deflected beam into a parallel beam; a stencil mask 20 having a plurality of predetermined block patterns each in the form of an opening; deflectors 21, 22 for deflecting the parallel beam from the lens 18 such that it is transmitted through a desired opening; deflectors 23, 24 for deflecting the beam shaped into a shape of the opening back to an original optical axis; a lens 19 for focussing the beam; a blanking deflector 25 for deflecting the focussed beam; a lens 26 for reducing a cross section of the deflected beam; a member 27 having a round aperture for transmitting the reduced beam; lenses 28, 29 for projecting the transmitted beam on the wafer 32; and electrostatic or electromagnetic deflectors 30, 31 for controlling the deflection of the projected electron beam.

Also, reference 39 denotes a detector for detecting electrons reflected from a surface of the wafer 32 by the application of the projected electron beam. Note, as a unit for deflecting an electron beam, magnetic deflectors 34 to 38 can be employed for alignment of the axis of the beam.

Figure 5A:
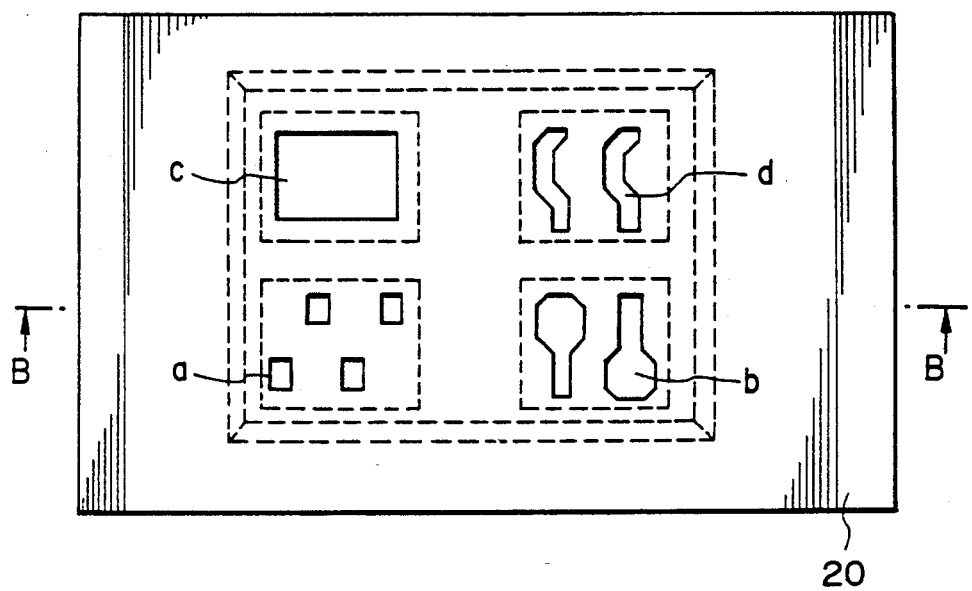
FIGS. 5a and 5b are views showing a constitution of the stencil mask 20 shown in FIG. 4.
Figure 5B:
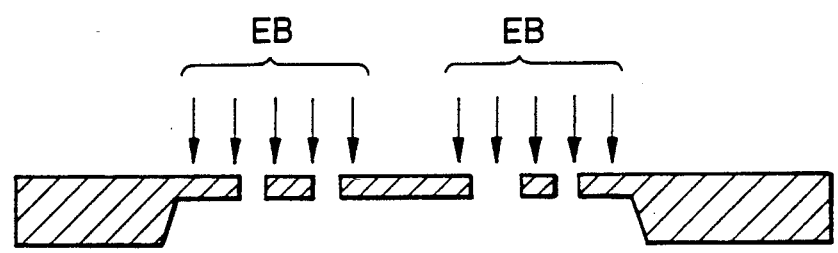

FIGS. 5a and 5b show a constitution of the stencil mask 20.

As is illustrated, the region of block patterns formed on the stencil mask is formed in the form of a thin film, where each pattern in the form of an opening is formed by means of an etching processing. In the illustration, four block patterns (a to d) are formed. Also, a substrate of the mask is composed of silicon (Si).

On the other hand, the control unit 40 includes: a central processing unit (CPU) 41, a magnetic disk 42 for storing exposure pattern data (including codes for selecting block patterns), a magnetic tape 43 and an interface 44 connected via a bus SB to each other; a controller 45, operatively connected to the interface 44, for controlling the deflection of a beam corresponding to a selected block pattern; a memory 45a connected to the controller 45; D/A converters and drivers 46 to 48 each for converting deflection data (digital values) fed from the controller 45 into analog values and amplifying the converted deflection data to drive the corresponding deflector 17, 21 to 24, 25; a mask driver 49, operatively connected to the interface 44, for controlling movement of the stencil mask 20; a deflection control circuit 50, operatively connected to the interface 44, for controlling the deflection of a beam to be projected on the wafer 32 under control of the controller 45; a D/A converter and driver 51 for converting deflection data (digital values) fed from the deflection control circuit 50 into analog values and amplifying the converted deflection data to drive the corresponding deflector 30, 31; an amplifier 52 for amplifying a waveform corresponding to a distribution of reflected electrons detected by the detector 39; a signal analyzer 53 operatively connected to the interface 44; and a memory 53a connected to the signal analyzer 53.

The memory 45a stores data (information) of quantities of offset corresponding to respective transfer positions of the deflected beam on the wafer 32 dependent on geometrical conditions (arrangement and shape) of each of the block patterns, as data indicating compensated quantities of the above deflection data. In an actual exposure, the controller 45 reads data of a quantity of offset corresponding to a selected block pattern from the memory 45a and, based on the read data, the deflection control circuit 50 controls the deflection of the beam corresponding to the selected block pattern. On the other hand, the memory 53a stores data of the amplified waveform (measured waveform) corresponding to the reflected electrons detected by the detector 39 and data of the aforementioned forecast waveform. The signal analyzer 53 has functions of analyzing the amplified signal (measured waveform) from the amplifier 52 and comparing the measured waveform with the forecast waveform.

In the present embodiment, the mark pattern is provided on the wafer 32 or the stage 33 located on the substantially same height as a surface of the wafer 32.

Next, the method for determining the forecast waveform characterizing the present invention will be explained with reference to FIGS. 6a, 6b to 10.

Figure 6A:
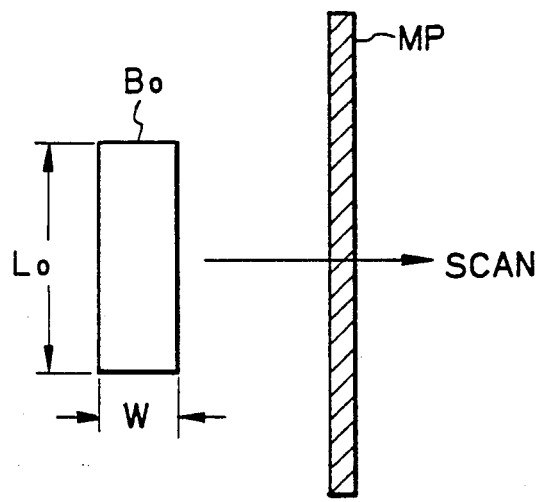
FIGS. 6a and 6b are views for explaining a concrete example of the processing P1 shown in FIG. 3.
Figure 6B:
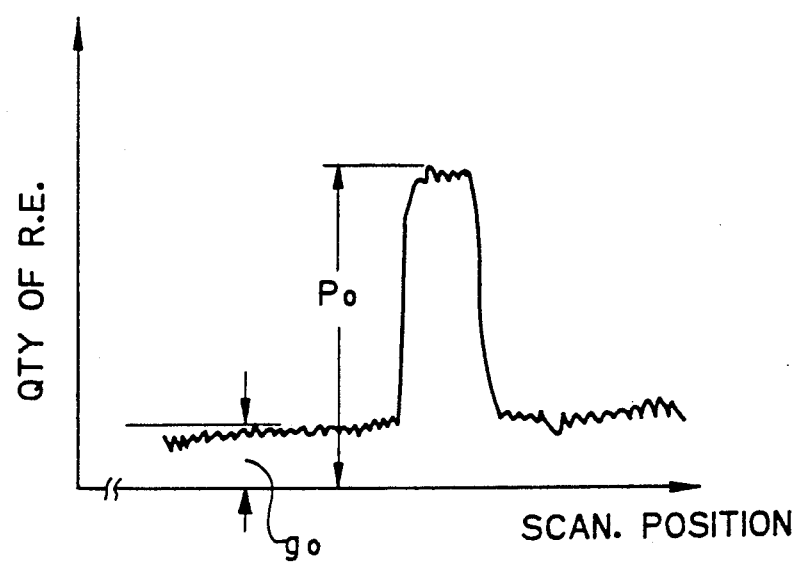

FIGS. 6a and 6b illustrate an example of the processing P1 shown in FIG. 3.

Referring to FIG. 6a, a rectangular beam $B_0$ having a predetermined width W in the scanning direction and having a constant length $L_0$ in the direction perpendicular to that of the width is scanned on a mark pattern MP having a constant shape, and thus, a waveform corresponding to a distribution of reflected electrons is measured. An example of the measured waveform is shown in FIG. 6b, where references $P_0$ and $g_0$ indicate maximum and minimum values, respectively.

Figure 7A:
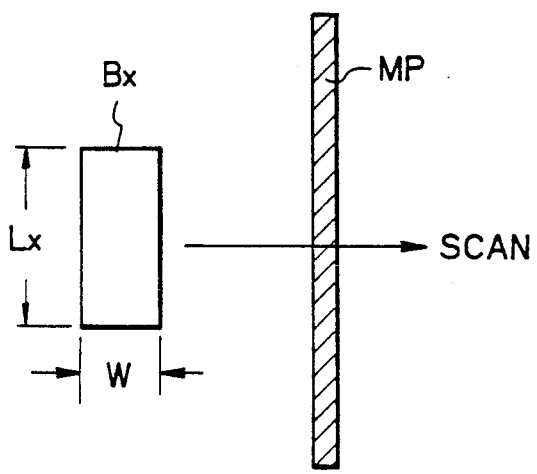
FIGS. 7a and 7b are views for explaining a concrete example of the processing P2 shown in FIG. 3.
Figure 7B:
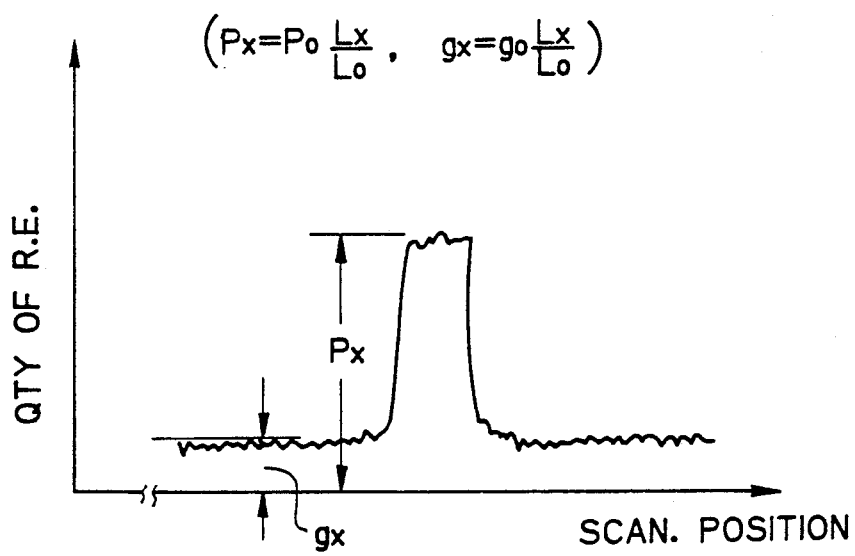

FIGS. 7a and 7b illustrate an example of the processing P2 shown in FIG. 3.

In the illustration, assuming that a rectangular beam Bx having the same width W as that of the rectangular beam $B_0$ and having an arbitrary length Lx in the direction perpendicular to that of the width is scanned on the mark pattern MP. In this case, a waveform corresponding to a distribution of reflected electrons forecast to be obtained in the scanning is calculated from the measured waveform shown in FIG. 6b. Namely, since the area of a cross section of the rectangular beam Bx is $Lx/L_0$ times that of the rectangular beam $B_0$, the quantity of reflected electrons corresponding to the rectangular beam Bx is also forecast to be $Lx/L_0$ times that corresponding to the rectangular beam $B_0$.

Accordingly, a maximum value Px and a minimum value gx of the waveform are calculated as follows:

$$Px = P_0 \cdot Lx/L_0$$

$$gx = g_0 \cdot Lx/L_0$$

The calculated waveform is used as a "basic waveform".

Figure 8:
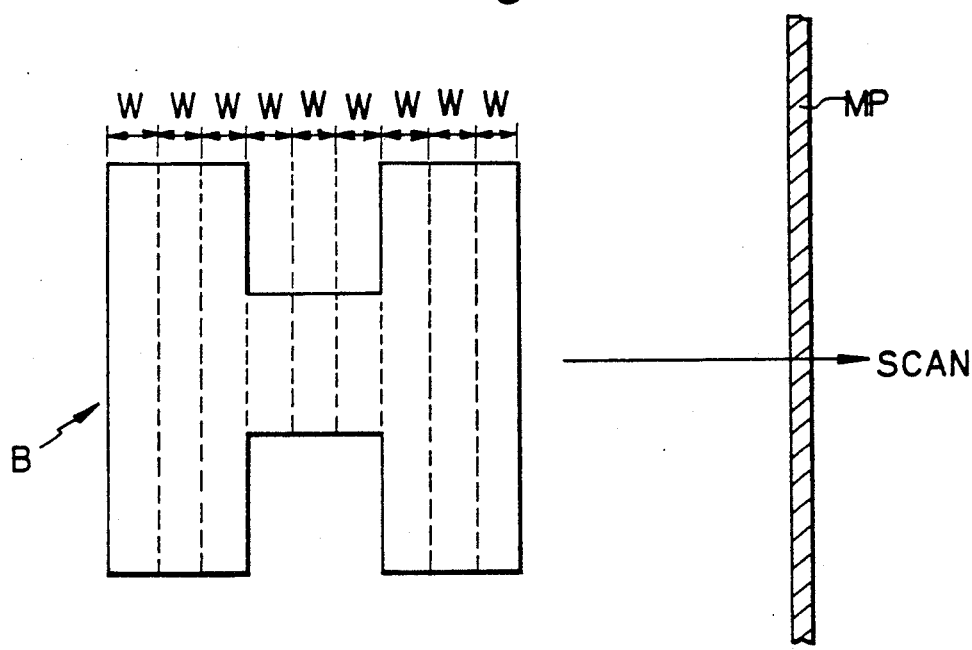
FIG. 8 is a view for explaining a concrete example of the processing P3 shown in FIG. 3.

FIG. 8 illustrates an example of the processing P3 shown in FIG. 3.

In the illustration, a cross section of a beam B corresponding to a selected block pattern is divided into a plurality of portions with units of the predetermined width W in the scanning direction. In the example, the cross section is divided into nine portions.

FIG. 9 illustrates an example of the processing P4 shown in FIG. 3.

In the illustration, assuming that only a beam (b1~b9) corresponding to each of the divided plurality of portions is scanned on the mark pattern MP. In this case, respective waveforms corresponding to each partial beam b1~b9 are calculated from the area of a cross section of the corresponding partial beam and the basic waveform shown in FIG. 7b.

Figure 10:
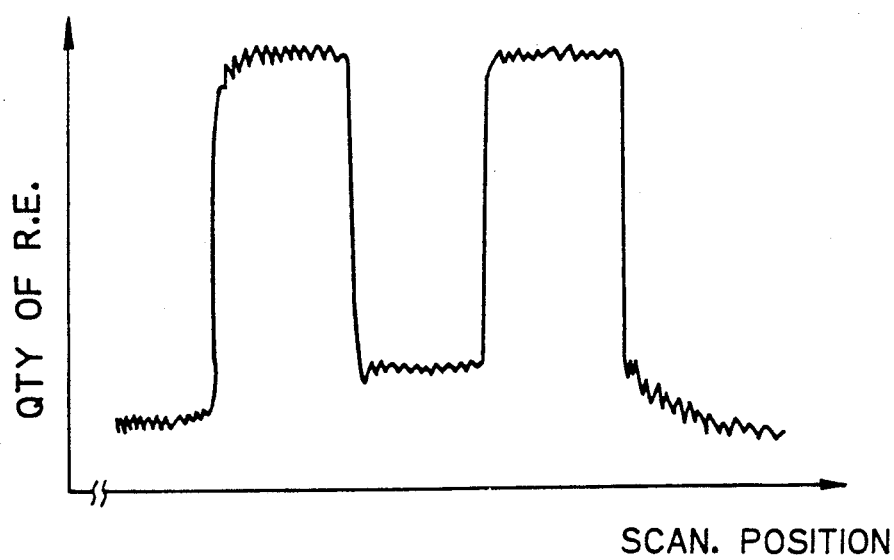
FIG. 10 is a view for explaining a concrete example of the processing P5 shown in FIG. 3.

FIG. 10 illustrates an example of the processing P5 shown in FIG. 3.

The above calculated respective waveforms corresponding to each partial beam b1~b9 are sequentially displaced with units of the predetermined width W and overlapped. By the overlapping, the forecast waveform obtained in the scanning of the whole selected block pattern on the mark pattern MP is determined.

Since the forecast waveform is determined under consideration of all of factors, e.g., arrangement of the mark pattern MP, dispersion in the operation of the detector 39 for reflected electrons, performances of the amplifiers, and the like, it considerably approximates to the actual waveform. Therefore, where the magnitude of quantity of the reflected electrons and the scanning position of the beam are matched or harmonized between the forecast waveform and the actual waveform, the beam position is determined with high precision. Namely, it is possible to precisely determine the position of application of the beam to the wafer and thus effect the exposure with high precision.

Figure 11:
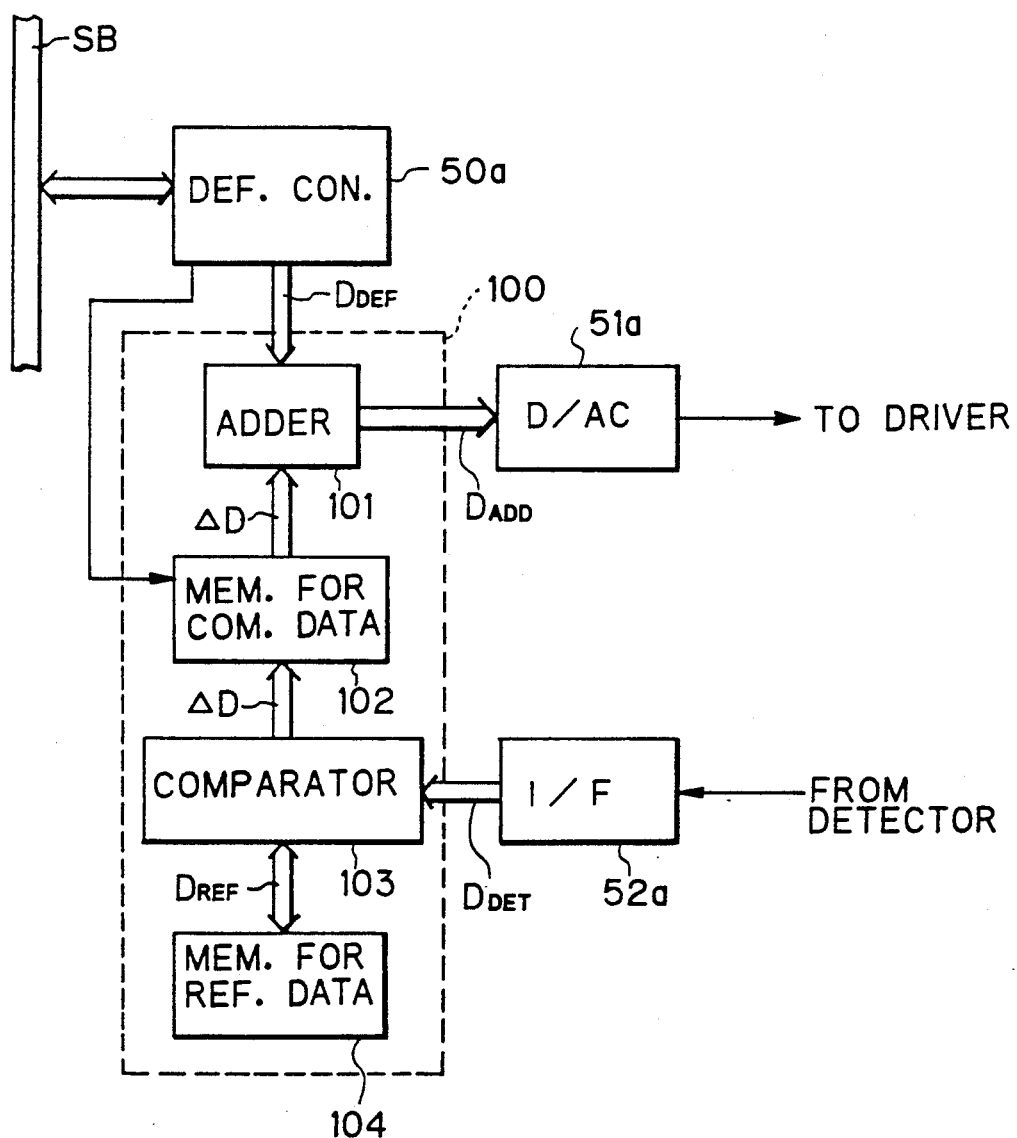
FIG. 11 is a block diagram illustrating a constitution of the main part in the E.B. exposing apparatus according to another embodiment of the present invention.

FIG. 11 illustrates a constitution of the main part in the E.B. exposing apparatus according to another embodiment of the present invention.

In contrast with the constitution of FIG. 4, a deflection controller 50a and a deflection compensating circuit 100 in combination correspond to the the controller 45, memory 45a, deflection control circuit 50, signal analyzer 53 and memory 53a. Also, a D/A converter 51a corresponds to part of the D/A converter and driver 51 and a reflected electron signal detecting circuit 52a corresponds to the amplifier 52.

The deflection compensating circuit 100 includes: a memory 104 corresponding to the memory 53a, for storing reference data ($D_{REF}$); a comparator 103 for comparing the reference data (forecast waveform) with measured data ($D_{DET}$) from the circuit 52a; a memory 102 corresponding to the memory 45a, for storing compensated data ($\Delta D$) from the comparator 103; and an adder 101 for adding the compensated data to a deflection data ($D_{DEF}$) fed from the deflection controller 50a to produce compensated deflection data ($D_{ADD}$). The reading of the compensated data from the memory 102 is carried out based on a selection signal (S) from the deflection controller 50a.

Figure 12:
FIG. 12 is a view showing a relationship between each of the selective block patterns and the corresponding compensated quantity of deflection data.

FIG. 12 shows the content of the compensated data memory 102, i.e., a relationship between each of the selective block patterns ($P_1 \sim P_n$) and the corresponding compensated quantity of deflection data ($\Delta D_1 \sim \Delta D_n$). The compensated data are prepared prior to the exposing processing.

Figure 13A:
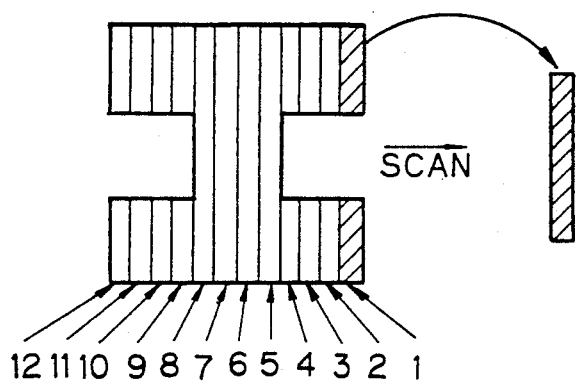
FIGS. 13a to 13c are views showing modifications of the processing (P3) shown in FIG. 8.
Figure 13B:
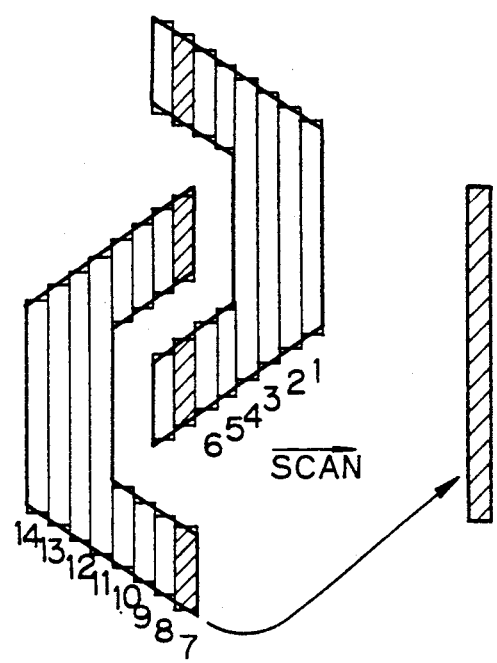
Figure 13C:
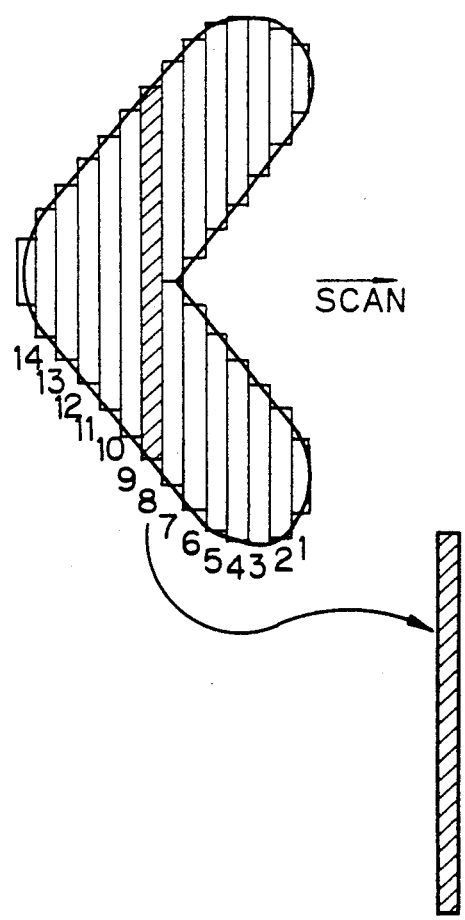

FIGS. 13a to 13c showing modifications of the processing P3 shown in FIG. 8.

Although, in the processing P3 shown in FIG. 8, each divided portion is composed of a single portion, this is not a restriction. For example, as shown in FIGS. 13a to 13c, each portion divided with units of the predetermined width in the scanning direction may be composed of a plurality of portions. Referring to FIG. 13b, the seventh portion (hatched portion) is composed of four portions (see also portions 1-6 which are non-hatched in FIG. 13c.

Although, in the above described embodiments, the basic beam (see FIG. 6a) has a rectangular cross section, this is not a restriction. In general, the basic beam is composed of a beam having the predetermined width W in the scanning direction and having a constant cross section. Also, although the exposure using the electron beam is carried out in the above embodiments, a beam having charges such as an ion beam (charged particle beam) can be employed.

Although the present invention has been disclosed and described by way of two embodiments, it is apparent to those skilled in the art that other embodiments and modifications of the present invention are possible without departing from the spirit or essential features thereof.

I claim:

1. An apparatus for effecting an exposure of a sample to a charged particle beam, the apparatus comprising:
    an optical unit for shaping a cross section of the charged particle beam into a shaped beam corresponding to a predetermined selective block pattern, giving appropriate optical treatments to the shaped beam, and deflecting the shaped beam based on deflection data to project a deflected beam on the sample; and a deflection control means, connected to said optical unit, for detecting a distribution of reflected charged particles obtained when a beam corresponding to the selective block pattern is actually scanned on a mark pattern located at a predetermined position, calculating a compensated quantity of the deflection data based on a comparison of a waveform based on the distribution and a forecast waveform based on a specific calculation, and thus controlling deflection of the charged particle beam, the deflection control means including scanning means for scanning a first beam having a predetermined width in a scanning direction and having a constant cross section on the mark pattern and for measuring a waveform corresponding to the distribution of reflected charged particles generated based on the scanning, calculating means, connected to said scanning means, for calculating a waveform corresponding to the distribution of reflected charged particles forecast to be obtained when a second beam having said predetermined width and having an arbitrary cross section is scanned on the mark pattern, as a basic waveform, based on the measured waveform, dividing means, connected to said calculating means, for dividing a cross section of the beam corresponding to the selective block pattern into a plurality of portions by said predetermined width in the scanning direction, forecasting means, connected to said dividing means, for calculating respective waveforms forecast to be obtained when only a beam corresponding to each of the divided plurality of portions is scanned on the mark pattern, based on said basic waveform and a cross section of the beam of the corresponding options, and combining means, connected to said forecasting means, for sequentially displacing the calculated respective waveforms with units of said predetermined width and for overlapping the displaced waveforms wherein said forecast waveform forecast to be obtained when a beam corresponding to a whole selective block pattern is scanned on the mark pattern is determined.

2. An apparatus as set forth in claim 1, wherein each of said first beam and second beam has a rectangular cross section.

3. An apparatus as set forth in claim 1, wherein said charged particle beam is an electron beam.

4. An apparatus as set forth in claim 1, wherein each divided portion of the cross section of the beam corresponding to the selective block pattern is composed of a sinle portion.

5. An apparatus as set forth in claim 1, wherein each divided portion of the cross section of the beam corresponding to the selective block pattern includes a plurality of portions.

6. An apparatus as set forth in claim 1, wherein said optical unit comprises a masking means having said selective block pattern in plural numbers each in the form of an opening.

7. An apparatus as set forth in claim 6, wherein said deflection control means comprises a memory means in which data of quantities of offset corresponding to respective transfer positions of the deflected beam on the sample dependent on geometrical conditions of each of the plurality of selective block patterns are stored as data indicating compensated quantities of said deflection data, wherein the deflection control means reads data of a quantity of offset corresponding to a selected block pattern in an actual exposure from the memory means and controls the deflection of the beam corresponding to the selected block pattern.

8. An apparatus as set forth in claim 7, wherein the sample is a semiconductor wafer.

9. An apparatus as set forth in claim 7, wherein said optical unit further comprises:

a beam generating means for emitting a charged particle beam;

a first optical means for directing the charged particle beam emitted from the beam generating means to said masking means;

a first deflecting means, provided both in a beam incidence side of the masking means and a beam emission side thereof, for deflecting the beam from the first optical means such that it is transmitted through a desired opening in the masking means and then deflecting the beam shaped into a shape of the opening back to an original optical axis;

a second optical means for reducing a cross section of the shaped beam from the first deflecting means to direct the beam to the sample; and a second deflecting means, provided in a vicinity of the sample, for deflecting the reduced beam from the second optical means according to a compensated deflection data from the deflection control means and projecting the deflected beam on the sample.

10. An apparatus comprising:

an optical unit for shaping a cross section of a charged particle beam into a shaped beam corresponding to a predetermined selective block pattern and for deflecting the shaped beam to project the shaped beam on a sample; and a deflection control means, connected to said optical unit, for controlling deflection of a charged particle beam to be projected on the sample, the deflection control means including detecting means for detecting a distribution of reflected charged particles obtained when the shaped beam is actually scanned on a mark pattern located at a predetermined position;

measuring means, connected to said detecting means, for measuring a waveform based on the detection;

scanning means for scanning a beam having a predetermined width in a scanning direction and having a constant cross section on the mark pattern to measure a waveform corresponding to a distribution of reflected charged particles generated by the scanning;

calculating means, connected to said scanning means, for calculating a waveform corresponding to a distribution of reflected charged particles forecast to be obtained when a beam having said predetermined width and having an arbitrary cross section is scanned on the mark pattern, as a basic waveform, based on the measured waveform;

dividing means, connected to said calculating means, for dividing a cross section of the beam corresponding to the selective block pattern into a plurality of portions by said predetermined width in the scanning direction;

forecasting means, connected to said dividing means, for calculating respective waveforms forecast to be obtained when only a beam corresponding to each of the divided plurality of portions is scanned on the mark pattern, based on said basic waveform and a cross section of the beam of the corresponding portion;

combining means, connected to said forecasting means, for sequentially displacing calculated respective waveforms with units of said predetermined width and for overlapping the displaced waveforms to determine a forecast waveform; and comparison means, connected to said combining means and said measuring means, for calculating a compensated deflection data based on a comparison of the forecast waveform and the waveform measured for the shaped beam wherein the deflection control means controls the deflection of the beam based on the compensated deflection data.

11. A method for effecting an exposure of a sample to a charged particle beam, the method comprising the steps of:

shaping a cross section of a charged particle beam into a shape corresponding to a predetermined selective block pattern;

detecting a distribution of reflected charged particles obtained when the shaped beam is actually scanned on a mark pattern located at a predetermined position;

measuring a waveform based on the detecting;

determining a forecast waveform based on a specific calculation;

calculating a compensated deflection data based on a comparison of the measured waveform and the forecast waveform; and deflecting the charged particle beam based on the compensated deflection data to project the deflected beam on the sample, wherein the step of determining the forecast waveform comprises the substeps of:

scanning a beam having a predetermined width in the scanning direction and having a constant cross section on the mark pattern to measure a waveform corresponding to a distribution of reflected charged particles generated by the scanning;

calculating a waveform corresponding to a distribution of reflected charged particles forecast to be obtained when a beam having said predetermined width and having an arbitrary cross section is scanned on the mark pattern, as a basic waveform, based on the measured waveform;

dividing a cross section of the beam corresponding to the selective block pattern into a plurality of portions by said predetermined width in the scanning direction;

calculating respective waveforms forecast to be obtained when only a beam corresponding to each of the divided plurality of portions is scanned on the mark pattern, based on said basic waveform and a cross section of the beam of the corresponding portion; and sequentially displacing the calculated respective waveforms with units of said predetermined width and overlapping the displaced waveforms to determine said forecast waveform.

12. A method for determining a forecast waveform used in a scanning and deflection of a charged particle beam on a sample, the method comprising the steps of:

scanning a beam having a predetermined width in the scanning direction and having a constant cross section on a mark pattern located at a predetermined position;

measuring a waveform corresponding to a distribution of reflected charged particles generated by the scanning;

calculating a waveform corresponding to a distribution of reflected charged particles forecast to be obtained when a beam having said predetermined width and having an arbitrary cross section is scanned on the mark pattern, as a basic waveform, based on the measured waveform;

dividing a cross section of the beam corresponding to a selective block pattern into a plurality of portions by said predetermined width in the scanning direction;

calculating respective waveforms forecast to be obtained when only a beam corresponding to each of the divided plurality of portions is scanned on the mark pattern, based on said basic waveform and a cross section of the beam of the corresponding portion; and sequentially displacing the calculated respective waveforms with units of said predetermined width and overlapping the displaced waveforms to determine said forecast waveform.

13. A method for determining a compensated quantity of deflection data used in a deflection of a charged particle beam on a sample, the method comprising the steps of:

scanning a beam having a predetermined width in the scanning direction and having a constant cross section on a mark pattern located at a predetermined position, to measure a waveform corresponding to a distribution of reflected charged particles generated by the scanning;

calculating a waveform corresponding to a distribution of reflected charged particles forecast to be obtained when a beam having said predetermined width and having an arbitrary cross section is scanned on the mark pattern, as a basic waveform, based on the measured waveform;

dividing a cross section of the beam corresponding to a predetermined selective block pattern into a plurality of portions by said predetermined width in the scanning direction;

calculating respective waveforms forecast to be obtained when only a beam corresponding to each of the divided plurality of portions is scanned on the mark pattern, based on said basic waveform and a cross section of the beam of the corresponding portion;

sequentially displacing the calculated respective waveforms with units of said predetermined width and overlapping the displaced waveforms to determine a forecast waveform;

measuring a waveform corresponding to a distribution of reflected charged particles obtained when the beam corresponding to the predetermined selective block pattern is actually scanned on the mark pattern; and comparing the measured waveform and the forecast waveform to determine the compensated quantity of deflection data.

* * * * *